United States Patent [19]
Daniel

[11] 3,858,118
[45] Dec. 31, 1974

[54] ACOUSTIC SURFACE WAVE TELEVISION TUNER

[75] Inventor: Michael R. Daniel, Monroeville, Pa.

[73] Assignee: Westinghouse Electric Corporation, Pittsburgh, Pa.

[22] Filed: July 17, 1973

[21] Appl. No.: 380,183

[52] U.S. Cl. ...................... 325/465, 333/72, 334/47, 334/86
[51] Int. Cl. ........ H04b 1/18, H03h 7/04, H03h 9/20
[58] Field of Search .................. 333/6, 30 R, 71, 72; 334/47, 86, 87; 325/465, 489

[56] References Cited

UNITED STATES PATENTS 3,750,027 7/1973 Hartmann ......................... 333/72 X

*Primary Examiner*—Paul L. Gensler
*Attorney, Agent, or Firm*—C. F. Renz

[57] ABSTRACT

A television channel selector device which utilizes acoustic surface wave propagating means and reconversion means to permit signal separation and utilization. An input transducer network is disposed upon a piezoelectric substrate, with individual metal interdigitated grid structures designed to convert a predetermined bandwidth input electrical signal to a corresponding acoustic surface wave. A pair of output transducers is disposed on either side of each individual input transducer. The output transducers are designed to convert the surface waves corresponding to a specific channel bandwidth to an electrical signal for generating the television display.

7 Claims, 2 Drawing Figures

ACOUSTIC SURFACE WAVE TELEVISION TUNER

BACKGROUND OF THE INVENTION

The phenomenon of acoustic surface waves has found important recent applications in radar and communcations signal processing. The surface wave transducers offer important practical advantage in being of small physical size and quite adaptable to integrated micro-circuit fabrication. A recent review of advances in the field is given in an article by J. deKlerk, "Ultrasonic Transducers," in *Ultrasonics*, Volume 9, No. 1, pages 35–48, January 1971.

The commercial television signal tuners now in use typically use variable inductors for separating the desired signal from the incoming spectrum of signals. The present invention details a channel selector or tuner which utilizes the phenomenon of acoustic surface waves. The entire television broadcast band range of 54 to 890 megahertz can be covered and discriminated using a very small device.

The typical acoustic surface wave device is well known and generally comprises a piezoelectric substrate with a transducer disposed on a selected surface. The transducer generally comprises conductive interdigitated grids or combs. The individual fingers which make up the grids have a width and spacing such as to launch acoustic surface waves in response to an input signal of predetermined bandwidth.

SUMMARY OF THE INVENTION

A tuner for selectively receiving television signals comprising a piezoelectric substrate on which acoustic surface waves may be propagated. A centralized input transducer network is disposed on a selected surface of the substrate. The network comprises a plurality of input transducers which are respectively designed to launch acoustic surface waves as a function of a selected input bandwidth. The acoustic surface waves are propagated across the surface of the substrate. A row of output transducers are disposed on the selected substrate surface on either side of the centralized input transducer network. Paired sets of output transducers are disposed adjacent individual input transducers, one in either row. The output transducers are designed to receive acoustic surface waves representative of a selected channel bandwidth and convert such waves to an electromagnetic signal of a selected channel bandwidth. A switching means is connected to each of said output transducers for selectively applying the desired electromagnetic channel bandwidth signal to the television display generating network.

DESCRIPTION OF THE PREFERRED EMBODIMENTS

Figure 1:
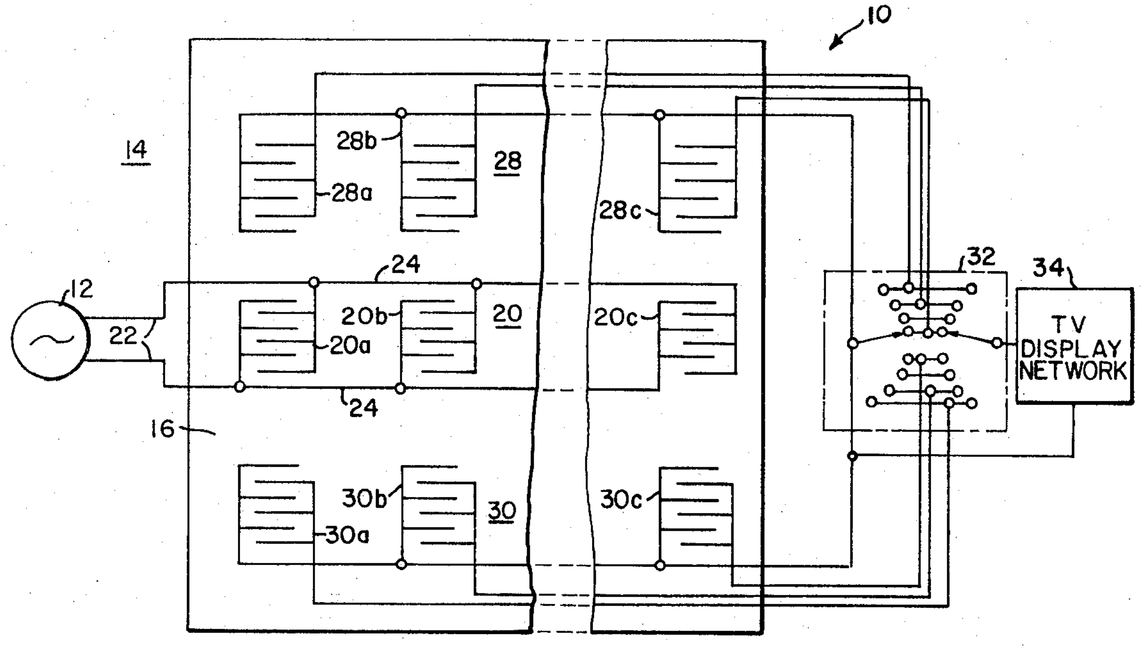
FIG. 1 is a schematic representation of the tuner system of the present invention.

The present invention can be best understood by reference to the exemplary embodiment shown in the drawings. In FIG. 1, the television tuner system 10 is shown. The television signal source 12 is the signal had from a receiving antenna and r.f. amplifier. An acoustic surface wave transducer means 14 comprises a piezoelectric substrate 16 on which acoustic surface waves may be propagated. The substrate 16 can be lithium niobate, quartz or other inherent piezoelectric material with the appropriate crystallographic properties for transmission of acoustic surface waves. The substrate 16 may also comprise a silicon substrate with a thin piezoelectric film, such as zinc oxide, deposited thereon. A silicon substrate permits ease of fabrication, and other integrated circuit receiver components may be provided on the basic substrate.

A centrally disposed input transducer network 20 is provided in a linear array upon the substrate 16. A plurality of individual input transducers 20*a*, 20*b*, 20*c* are illustrated. In practice, as will be explained, the number of input transducers is preferably equal to one-half the number of broadcast channels which are available. Thus, to cover the VHF television broadcast channels 2 through 13, six input transducers 20 are utilized.

The input signal is carried via input leads 22 from source 12. The leads 22 are connected to the network 20, and lines 24 parallel electrically connect the individual input transducers 20*a*, 20*b*, 20*c*.

Figure 2:
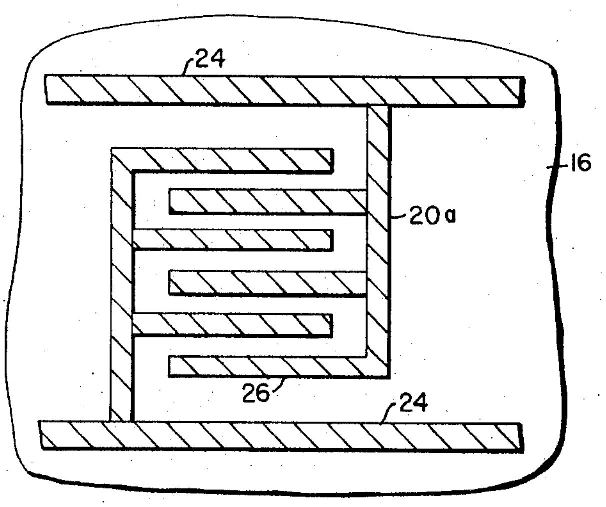
FIG. 2 is an enlarged plan view of one of the transducer elements used in the tuner system of the present invention.

An individual transducer is shown in FIG. 2, and comprises an interdigitated grid structure, formed of thin conductive fingers deposited on the substrate. The fingers 26 of the grid are typically formed of gold or aluminum, with a typical thickness of 1,000–2,000 angstroms laid down in the desired pattern by evaporative deposition. The typical width of an individual finger 26 is about one-half the center to center spacing between adjacent fingers. The center to center spacing between adjacent fingers is what determines the frequency operability of the transducer. By way of example, for a lithium niobate substrate, for the input transducer 20*a* designed to launch acoustic surface waves which represent received signals in the bandwidth of channels 2 and 3, i.e., 54 to 66 Mhz, five pairs of interdigitated fingers are laid down, with the center to center spacing being 1.11 mils. The finger length is not critical, and by way of example, is typically about 100 mils.

The acoustic surface waves are launched principally in the opposite directions normal to the linear array of input transducers. Two rows 28, 30 of output transducers are provided on the substrate on either side of the central linear array of input transducers. The rows 28, 30 comprise a plurality of output transducers 28*a*, 28*b*, 28*c*, 30*a*, 30*b* and 30*c*. The output transducers 28*a* and 30*a* are paired to adjacent input transducer 20*a* and receive the acoustic surface waves therefrom. The output transducers are spaced from the input transducer by a distance which permits electromagnetic screening to insure that there is only transference of the acoustic wave signal. A spacing of about one-half inch is adequate. The output transducers 28*a* and 30*a* are of the same interdigitated grid or comb structure as already explained with respect to the input transducer 20*a*. The transducer 28*a* is designed to convert the acoustic surface waves corresponding to the channel 2 bandwidth to electromagnetic signals. The channel 2 electromagnetic bandwidth is from 54–60 Mhz. The center to center spacing between adjacent fingers is 1.17 mils with ten pairs of fingers. The transducer 30*a* is designed to convert the acoustic surface waves corresponding to the channel 3 bandwidth to electromagnetic signals. The channel 3 bandwidth is from 60–66 Mhz, and the center to center spacing required is 1.06 mils.

The output of each output transducer is connected to selector switch 32, which may be a conventional wafer switch with as many poles as channels needed to permit selection of a particular television signal channel. The output of the selected output transducer is thereby fed to the television display generating network 34.

The short wavelengths of acoustic surface wave devices permit the device to be very small. The substrate thickness should be thick in comparison to the acoustic surface wavelength. The spacing of adjacent finger pairs and the reciprocal of the number of finger pairs determines the center frequency of the bandwidth to which the transducer is responsive.

The thin layered metal transducers can also be deposited upon the substrate by a conventional photolithographic technique.

In designing the range of operation of individual transducers the following formulae apply:

$$d = v_s/2f,$$

where $d$ is the center to center distance between adjacent fingers, $v_s$ is the velocity of source in the medium, and $f$ is the frequency, and $$B = 1/N,$$

where $B$ is the operating bandwidth, and $N$ is the number of pairs of fingers for the transducer.

I claim:

1. A tuner for selectively receiving television signals comprising:

a. a piezoelectric substrate on which acoustic surface waves may be propagated;

b. a centralized input transducer network disposed on a selected surface of the substrate, which network is comprised of a plurality of input transducers which are respectively designed to launch acoustic surface waves as a function of a selected bandwidth of an input signal applied to the network, which acoustic surface waves are propagated across the surface of said substrate;

c. a row of output transducers disposed on the selected substate surface on either side of the centralized input transducer network, with paired sets of output transducers which are designed to receive acoustic surface waves representative of a selected bandwidth disposed one in each row adjacent the input transducer which launches said selected bandwidth acoustic surface waves, each paired set of output transducers tuned respectively to adjacent television channel signals encompassed within the selected bandwidth for converting said acoustic surface wave to the respective electromagnetic channel signal;

d. switching means connected to each of said output transducers for selectively applying the desired electromagnetic channel signal to the television display generating network.

2. The tuner specified in claim 1, wherein the centralized input transducer network comprises a generally linear array of parallel connected interdigitated grids disposed to launch acoustic surface waves predominantly in directions normal to the linear array.

3. The tuner specified in claim 1, wherein the selected bandwidth to which respective input transducers are tuned encompasses two distinct television channel signal bandwidths.

4. The tuner specified in claim 1, wherein said input and output transducers are interdigitated grids or combs, with the individual fingers of respective transducers spaced a predetermined distance apart to tune the respective transducer to a specific bandwidth.

5. The tuner specified in claim 4, wherein said interdigitated grids or combs comprise a thin conductive layer upon the piezoelectric substrate.

6. The tuner specified in claim 4, wherein the individual finger width is about one-half the center to center spacing between adjacent fingers of the respective interdigital grid or comb.

7. A television receiver comprising a receiving antenna and coupled radio frequency amplifier, a channel selector tuner, and a television display generating network and display system, wherein the channel selector tuner comprises:

a. a piezoelectric substrate on which acoustic surface waves may be propagated;

b. a centralized input transducer network disposed on a selected surface of the substrate, which network comprises a plurality of input transducers which are respectively tuned to launch acoustic surface waves as a function of a selected bandwidth of applied television signal, which acoustic surface waves are propagated across the surface of the substrate;

c. two rows of output transducers disposed on the selected substrate surface, one row on either side of the centralized input transducer network, with paired sets of output transducers which are tuned to receive acoustic surface waves representative of a selected television signal bandwidth disposed one in each row adjacent to and in alignment with the respective input transducer which launches the selected bandwidth acoustic surface waves within the range to which the output transducers are tuned, each paired set of output transducers tuned respectively to receive acoustic surface waves which correspond to predetermined adjacent television channel signal bandwidths which are encompassed within the selected bandwidth, respective output transducers converting the surface wave to the desired electromagnetic channel signal;

d. switching means connected to each of said output transducers for selectively applying the desired electromagnetic channel signal to the television display generating network.

* * * * *